United States Patent [19]
Podlesny et al.

[11] Patent Number: 5,724,299
[45] Date of Patent: Mar. 3, 1998

[54] MULTIPORT REGISTER FILE MEMORY USING SMALL VOLTAGE SWING FOR WRITE OPERATION

[75] Inventors: Andrew V. Podlesny; Guntis V. Kristovsky; Yuri L. Pogrebnoy; Vladimir N. Kalmykov; Valeriy V. Lozovoy, all of Moscow, Russian Federation

[73] Assignee: Sun Microsystems, Inc., Mountain View, Calif.

[21] Appl. No.: 641,327

[22] Filed: Apr. 30, 1996

[51] Int. Cl.$^6$ ........................................... G11C 8/00
[52] U.S. Cl. .................................. 365/230.05; 365/205
[58] Field of Search ........................... 365/230.05, 156, 365/189.04, 205

[56] References Cited

U.S. PATENT DOCUMENTS

| | | | |
|---|---|---|---|
| 3,983,545 | 9/1976 | Cordaro | 365/156 |
| 4,368,529 | 1/1983 | Furuyama | 365/205 |
| 5,204,560 | 4/1993 | Bredin et al. | 365/205 |
| 5,471,420 | 11/1995 | Nii et al. | 365/205 |

OTHER PUBLICATIONS

Jolly, Richard D., "A 9-ns, 1.4-Gigbyte/s, 17-Ported CMOS Register File", IEEE Journal of Solid-State Circuits, vol. 26, No. 10, Oct. 1991, pp. 1407–1412.

Primary Examiner—David C. Nelms
Assistant Examiner—Michael T. Tran
Attorney, Agent, or Firm—D'Alessandro & Ritchie

[57] ABSTRACT

A multiport register file memory includes a cross-coupled sense amplifier as a storage element. A buffered switching circuit provides a voltage potential to the storage element in response to a write enable signal for switching-on/off the storage element. Each storage element provides two storage nodes which are coupled to corresponding switched bit lines. Coupling between each storage node and corresponding switched bit lines is provided by a pass transistor that is controlled by a word line attached to a gate of the pass transistor. The write operation begins by powering-off at least one controlled supply voltage rail that provides a voltage potential to the storage element. A small voltage swing of between two hundred and five hundred millivolts (200–500 mV) is supplied from the bit lines to the storage nodes of the sense amplifier through the pass transistors. The cross-coupled sense amplifier is then switched on by connecting the sense amplifier to the supply voltage node previously switched-off by the buffered switching circuit. Switching on the sense amplifier results in the amplification of the small voltage swing and storage of the resulting signal. The storage nodes are then accessed by using word lines to activate corresponding pass transistors capable of passing small or large voltage swing signals held by the storage element.

16 Claims, 3 Drawing Sheets

MULTIPORT REGISTER FILE MEMORY USING SMALL VOLTAGE SWING FOR WRITE OPERATION

BACKGROUND OF THE INVENTION

1. Field of the Invention

The present invention relates to multiport memory technology. More particularly, the present invention relates to a multiport register file having a cross-coupled sense amplifier using a small voltage swing for write operation.

2. The Prior Art

Multiport CMOS register files are known in the art. For example, one such multiport register file is discussed in the IEEE Journal of Solid-State Circuits, vol. 26, no. 10, October 1991 and is shown in FIG. 1 herein. The multiport register file of FIG. 1 has a nine-ported memory cell and associated read and write circuitry.

The nine-ported memory cell uses common bit and word lines for read and write operations, so they are performed in succession. The memory cell can be connected to six bit lines through N-channel MOS pass transistors, e.g., three pass transistors on every side of the flip-flop. This configuration provides six read ports (one bit line per port) and three write ports (two bit lines per port).

When differential sensing scheme is applied the bit line voltage swing value of 200 mV is sufficient for read operation.

The number of drawbacks of the multiport register file ("MRF") design of FIG. 1 comes from using full voltage swing on bit lines for writing data into memory cell. First, the significant amount of power is dissipated by precharge circuits when equalizing bit line potentials after write operation.

Second, the precharge time is proportional to the value of bit line voltage swing. To decrease precharge time the big precharge transistors and a powerful supply source are needed.

Third, the powerful data drivers are needed to provide acceptable write cycle time. The power dissipated by these drivers is large because of large voltage swing on bit lines.

Fourth, the waste time intervals between write pulses and precharge pulses are needed in order to eliminate short currents through data drivers and precharge circuits.

Last, the date storage reliability decreases, with the increase of the number of write ports. In the worst case when the same data are written through all write ports certain level of noise on unselected memory cell pass transistors gates leads to destruction of stored information. Thus, using full voltage swing for write operation in MRF increases read cycle, write cycle, power consumption and decreases reliability.

Despite the existence of the above register file memory, there remains room for improvement in the speed, reliability and power consumption.

It is an object of this invention to provide a multiport register file having small voltage swings for read and write operations, decreased power consumption, reduced bit line precharge time (i.e., increased speed), and increased reliability of data storage.

It is another object of this invention to provide a multiport register file using a cross-coupled sense amplifier as a storage element and one or two supply control lines to permit use of small voltage swings for read and write operations.

It is further object of this invention to provide small voltage swings for read and write operation for reading and writing data to a multiport register file using a cross-coupled sense amplifier as a storage element and one or two supply control lines.

BRIEF DESCRIPTION OF THE INVENTION

According to one embodiment of the present invention, a multiport register file contains a storage element having first and second storage nodes, a plurality of first and second switched bit lines connecting to the first and second storage nodes, and at least one controlled supply line providing for switching on/off the storage element. During write operation the storage element is switched-off, and a small voltage swing is placed on the first and second storage nodes from selected first and second switched bit lines. During read operation the storage element amplifies the small voltage swing and stores a resulting amplified signal when the storage element is switched on. The storage nodes are then accessed by using word lines to activate corresponding pass transistors capable of passing small or large voltage swing signals held by the storage element.

According to another embodiment of the present invention, P-channel pass transistors provide for the switching function of switched bit lines for access to the storage nodes during a read or write operation. A supply control line for sending a write enable signal to the input of a buffered switching circuit is used. In response to the write enable signal, the buffered switching circuit switches on/off the storage element by providing an appropriate supply voltage to the sources of the N-channel MOS transistors that define part of the storage element.

According to another embodiment of the present invention, N-channel pass transistors provide for the switching function of switched bit lines for access to the storage nodes during a read or write operation. A supply control line for sending a write enable signal to the input of a buffered switching circuit is used. In response to the write enable signal, the buffered switching circuit switches on/off of storage element by providing an appropriate supply voltage to the sources of the P-channel MOS transistors that define part of the storage element.

In yet another embodiment of the present invention, the multiport register file has first and second supply control lines for sending write enable signals to the input of a first and second buffered switching circuit that provides for a first and second supply voltage to the storage element for switching-on/off the storage element.

According to another embodiment of the present invention, the multiport register has more than one storage element to define a memory cell array. The storage elements are connected to the output of at least one buffered switching circuit for power-on/off control.

According to yet another embodiment of the present invention the multiport register file may be connected to a CPU via one or more data buses.

With regard to another feature of the present invention, the multiport register file is provided to a computer system.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 2:
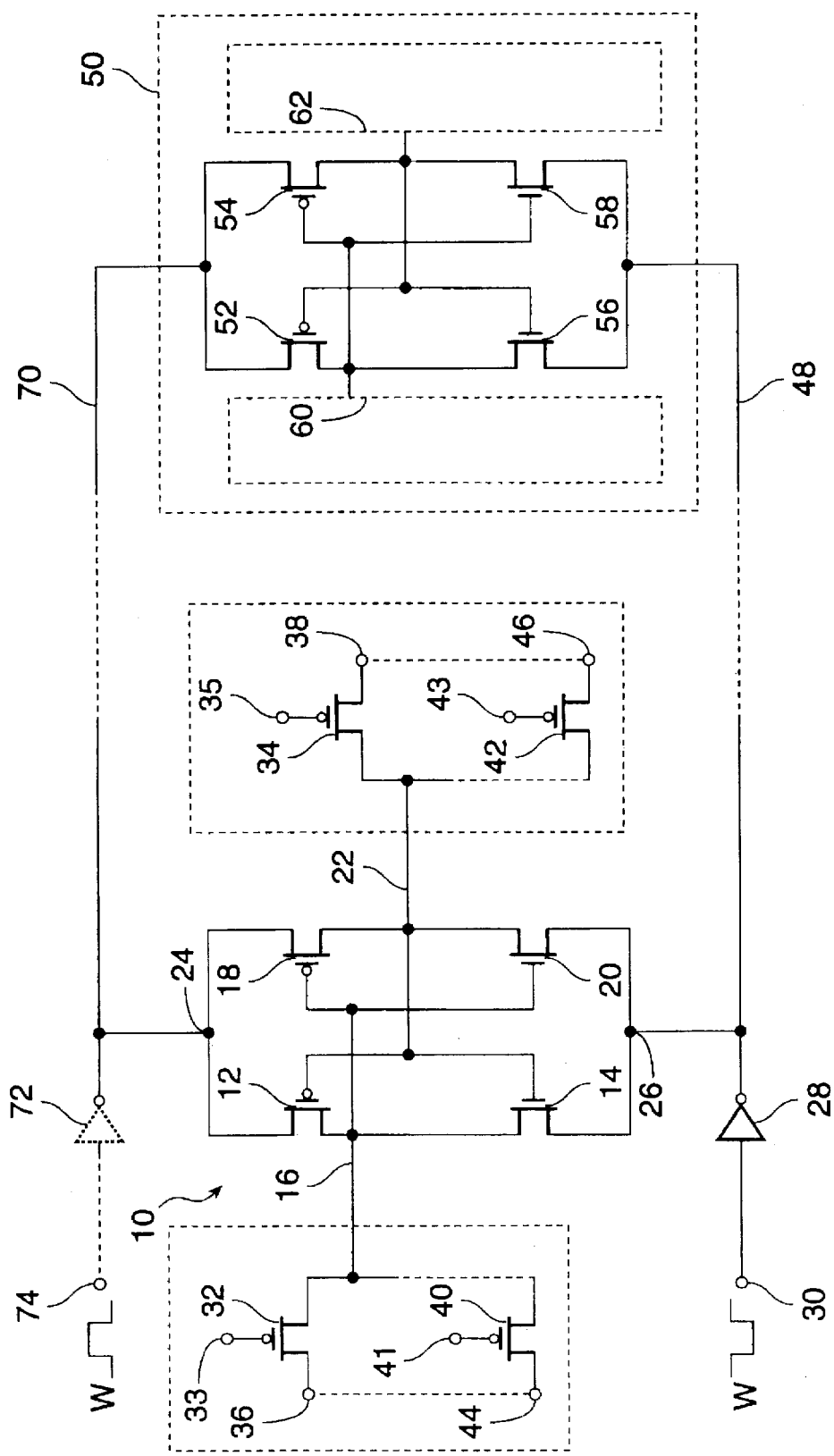
FIG. 2 is a schematic diagram of a plurality of multiport register file memory cells using small voltage swing for write operation according to a first embodiment of the present invention.

FIG. 2 is a schematic diagram of a plurality of multiport register file memory cells according to the first embodiment of the present invention. A first memory cell 10 has a storage element comprised of a pair of cross-coupled inverters forming a flip-flop and a plurality of P-channel pass transistors for coupling first and second storage nodes 16 and 20 of the flip-flop to bit lines 36 and 44 and bit lines 38 and 46, respectively. The first inverter has a P-Channel MOS transistor 12 and a N-Channel MOS transistor 14 having their gates connected together and their drains connected together forming the first storage node 16. The second inverter has a P-Channel MOS transistor 18 and a N-Channel MOS transistor 20 having their gates connected together and their drains connected together forming the second storage node 22. The cross-coupling is provided by connecting the gates of transistors 12 and 14 to the second storage node 22 and connecting the gates of transistors 18 and 20 to the first storage node 16.

The sources of P-Channel MOS transistors 12 and 18 connect to node 24 for supplying a positive voltage potential such as 5 volts and the sources of N-Channel MOS transistors 14 and 20 connect node 26 for supplying a potential such as ground. Node 26 is a switched node because it is controlled by the output of inverter 28 via the controlled negative supply voltage rail 48. The input of inverter 28 is driven by a write-enable signal through control supply line 30. The write-enable signal is generated during the write operation when the cell under consideration is addressed.

FIG. 2 also shows a first and second group of a plurality of P-channel pass transistors that define "switched bit lines" by having gates connecting to corresponding word lines, sources connecting to corresponding bit lines, and drains connecting to the first or second storage node 16 and 22 of the flip-flop. P-Channel pass transistors 32 and 34 are connected between first and second storage nodes 16 and 22 and switched bit lines 36 and 38. Word lines 33 and 35 are connected to the gates of pass transistors 32 and 34, respectively, and define a first word port. Similarly, P-channel pass transistors 40 and 42 are connected between first and second storage nodes 16 and 22 and switched bit lines 44 and 46, respectively. Word lines 41 and 43 are connected to the gates of transistors 40 and 42, respectively, and define a second word port.

Those of ordinary skill in the art will recognize that while only two word ports (or 4 read ports via switched bit lines 36, 38, 44 and 46) are shown in memory cell 10, any number of ports may be provided in a particular design according to the present invention by providing additional pass transistors and word and bit lines. Note that the first and second group of a plurality of P-channel pass transistors use a small voltage swing for the storage nodes of the flip-flop.

Those of ordinary skill in the art will also recognize that the output of inverter 28 is connected to controlled negative supply voltage rail 48 for all of the memory cells in the row containing memory cell 10 ("memory cell array"). A partial schematic diagram of a second memory cell 50 is also shown in FIG. 2 comprising cross-coupled inverters formed from P-Channel MOS transistors 52 and 54 and N-Channel MOS transistors 56 and 58 configured in the same manner as MOS transistors 12, 14, 18, and 20 of memory cell 10. The sources of N-Channel MOS transistors 56 and 58 of memory cell 50 are connected to controlled negative supply voltage rail 48 as are the sources of N-channel MOS transistors 14 and 20 of memory cell 10. The P-channel pass transistors of the memory cell 50 are connected between storage nodes and switched bit lines in the memory cell 50 in the same manner as the P-channel pass transistors of memory cell 10 but have been depicted as dashed boxes to avoid over complicating the drawing figure.

During write operations, via supply control line 30, the write enable signal to inverter 28 is brought low, thus causing controlled negative supply voltage rail 48 to go to a logic high level of approximately the positive supply voltage potential. This turns off the accessed cross-coupled inverters comprising the memory cell while all other cells not accessed are under constant supply voltages during the entire clock cycle.

The gates of a selected pair of pass transistors from the first and second group of a plurality of P-channel pass transistors (e.g., pass transistors 32 and 34 having gates connecting to word lines 33 and 35, respectively) are turned on and a small voltage swing (i.e., 200–500 mV) is supplied to first and second storage nodes 16 and 22 via the switched bit lines of the selected port. Because the resistances of pass transistors are much greater then the resistances of N-channel transistors 14 and 20 of the flip-flop, the storage delay is determined by capacitances of nodes 16 and 22. The storage delay does not depend on bit line capacitances.

Thereafter, when the input to inverter 28 is again brought high using second supply control line 30, the voltage at controlled negative supply voltage rail 48 goes to approximately ground potential, thus turning on the cross-coupled inverters. The small voltage swing placed on the storage nodes is amplified by the cross-coupled inverters and stored thereon. The cross-coupled inverters amplify the corresponding small voltage swing placed on the storage nodes and store the resulting amplified signal thereon. The storage nodes are then accessed by using word lines to activate corresponding pass transistors capable of passing small or large voltage swing signals held by the storage element.

Those of ordinary skill in the art will appreciate that using the small voltage swings on the bit lines for write or read operations allows a significant decrease in power consumption and an increase in the speed of the memory because of the reduced bit line pre-charge time. Also, there is no need to provide waste time intervals between a precharge pulse and the write enable pulse because the output transistors (not shown) of data drivers can be chosen small enough to limit the short current at an acceptable level. In addition, the reliability of the data storage is increased, because it is impossible to trigger the flip-flop to change states by using a small voltage swing when its supply voltage is ON.

FIG. 2 also shows another embodiment of the present invention having an additional supply control line 74 and a buffered switching circuit such as inverter 72 connecting to positive controlled supply voltage line 70. This enables powering ON and OFF the storage elements (as part of the above read and write operations) using the supply control lines 30 and 72 to trigger the buffered switching circuits comprised of inverters 28 and 72 that in turn respond with appropriate voltages to switch-on/off any connected storage element.

Note that as presently preferred the controlled supply voltages are turned off during write operation for accessed cells only. All other cells are under constant supply voltages during the entire clock cycle.

Figure 3:
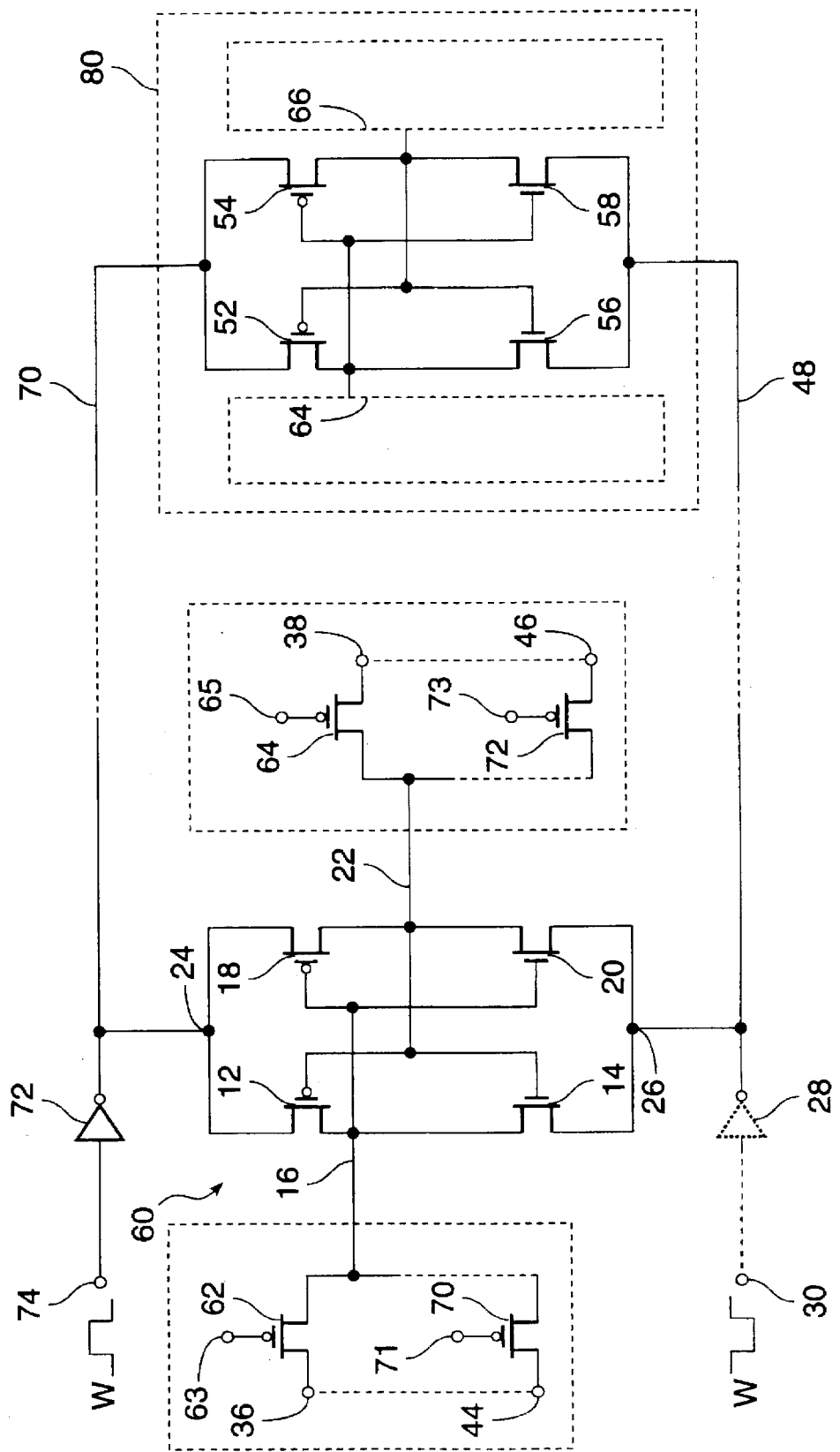
FIG. 3 is a schematic diagram of a plurality of multiport register file memory cells using small voltage swing for write operation according to a second embodiment of the present invention.

FIG. 3 is a schematic diagram of a second embodiment of the present invention. A first memory cell 60 is seen to comprise a cross-coupled pair of inverters. To the extent that circuit elements shown in FIG. 3 are similar to the elements shown in FIG. 2, the similar circuit elements in FIG. 3 will be given the same reference numerals as those in FIG. 2. For example, in FIG. 3 the first inverter comprising P-Channel MOS transistor 12 and N-Channel MOS transistor 14 will be cross-coupled to the second inverter comprising P-Channel MOS transistor 18 and N-Channel MOS transistor 20 in the same manner as in FIG. 2.

The sources of P-Channel MOS transistors 12 and 18 are connected together to node 24 for supplying a positive voltage potential such as 5 volts and the sources of N-Channel MOS transistors 14 and 20 are connected together to node 26 for supplying a potential such as ground. The node 24 is a switched node because it is controlled by the output of inverter 72 via controlled positive supply voltage rail 70. The input of inverter 72 is driven by a write-enable signal through supply control line 74.

FIG. 3 shows memory cell 60 having a plurality of ports using N-channel pass transistors to form "switched bit lines". The N-Channel pass transistors have gates connecting to corresponding word lines, sources connecting to corresponding switched bit lines, and drains connecting to first or second storage node 16 and 22 of the flip-flop.

Specifically, N-Channel pass transistors 62 and 64 are connected between first and second storage nodes 16 and 22 and switched bit lines 36 and 38. Word lines 63 and 65 are connected to the gates of N-channel transistors 62 and 64, respectively, and define a word port. Similarly, N-Channel pass transistors 70 and 72 are connected between first and second storage nodes 16 and 22 and switched bit lines 44 and 46, and have gates connected to word lines 71 and 73, as shown in FIG. 3. Word lines 71 and 73 define a second word port. Those of ordinary skill in the art will recognize that while only two ports are shown in memory cell 60, any number of ports could be provided in a particular design according to the present invention by providing additional pass transistors, word lines, and bit lines.

Also, those of ordinary skill in the art will recognize that the output of inverter 72 connects to controlled positive supply voltage rail 70 for all of the memory cells in the row containing memory cell 60 ("memory cell array"). A partial schematic diagram of a second memory cell 80 is also shown in FIG. 3 comprising cross-coupled inverters formed from P-Channel MOS transistors 52 and 54 and N-Channel MOS transistors 56 and 58 configured in the same manner as MOS transistors 12, 14, 18, and 20 of memory cell 60. The sources of P-Channel MOS transistors 52 and 54 of memory cell 80 are connected to controlled positive supply voltage rail 70 as are the sources of P-Channel MOS transistors 12 and 18 of memory cell 60. The pass transistors of the memory cell 80 are connected between the storage nodes and switched bit lines of memory cell 80 in the same manner as the pass transistors of memory cell 60 but have been depicted as dashed boxes to avoid over-complicating the drawing figure.

During write operations for the schematic diagram shown in FIG. 3, the write enable signal to inverter 72 is brought high via supply control line 74, thus causing the controlled positive supply voltage rail 70 to go to a logic low level of approximately the ground potential. This turns off the accessed cross-coupled inverters comprising the memory cell while all other cells not accessed are under constant supply voltages during the entire clock cycle.

The gates of a selected pair of N-channel pass transistors (e.g., pass transistors 62 and 70 having gates connecting word lines 63 and 65) are turned on and a small voltage swing (i.e., 200–500 mV) is supplied to first and second storage nodes 16 and 22 via the switched bit lines of the selected port. As in the second embodiment, because the resistances of pass transistors are much greater then the resistances of N-channel transistors 14 and 20 of the flip-flop, the storage delay is determined by capacitances of nodes 16 and 22. The storage delay does not depend on bit line capacitances.

Thereafter, when the write enable signal to inverter 72 is again brought low, the voltage at node 24 and controlled positive supply voltage rail 70 ramps to approximately the positive voltage potential, thus turning on the cross-coupled inverters. The small voltage swing placed on the first and second storage nodes 16 and 22 is amplified by the cross-coupled inverters and the resulting amplified signal stored thereon. The storage nodes are then accessed by using word lines to activate corresponding pass transistors capable of passing small or large voltage swing signals held by the storage element.

FIG. 3 also shows another embodiment of the present invention having an additional supply control line 30 and a buffered switching circuit such as inverter 28 connecting to negative controlled supply voltage line 48. This enables powering ON and OFF the storage elements (as part of the above read and write operations) using the supply control lines 30 and 72 to trigger the buffered switching circuits comprised of inverters 28 and 72.

Note that as presently preferred the controlled supply voltages are turned off during write operation for accessed cells only. All other cells are under constant supply voltages during the entire clock cycle.

Figure 1:
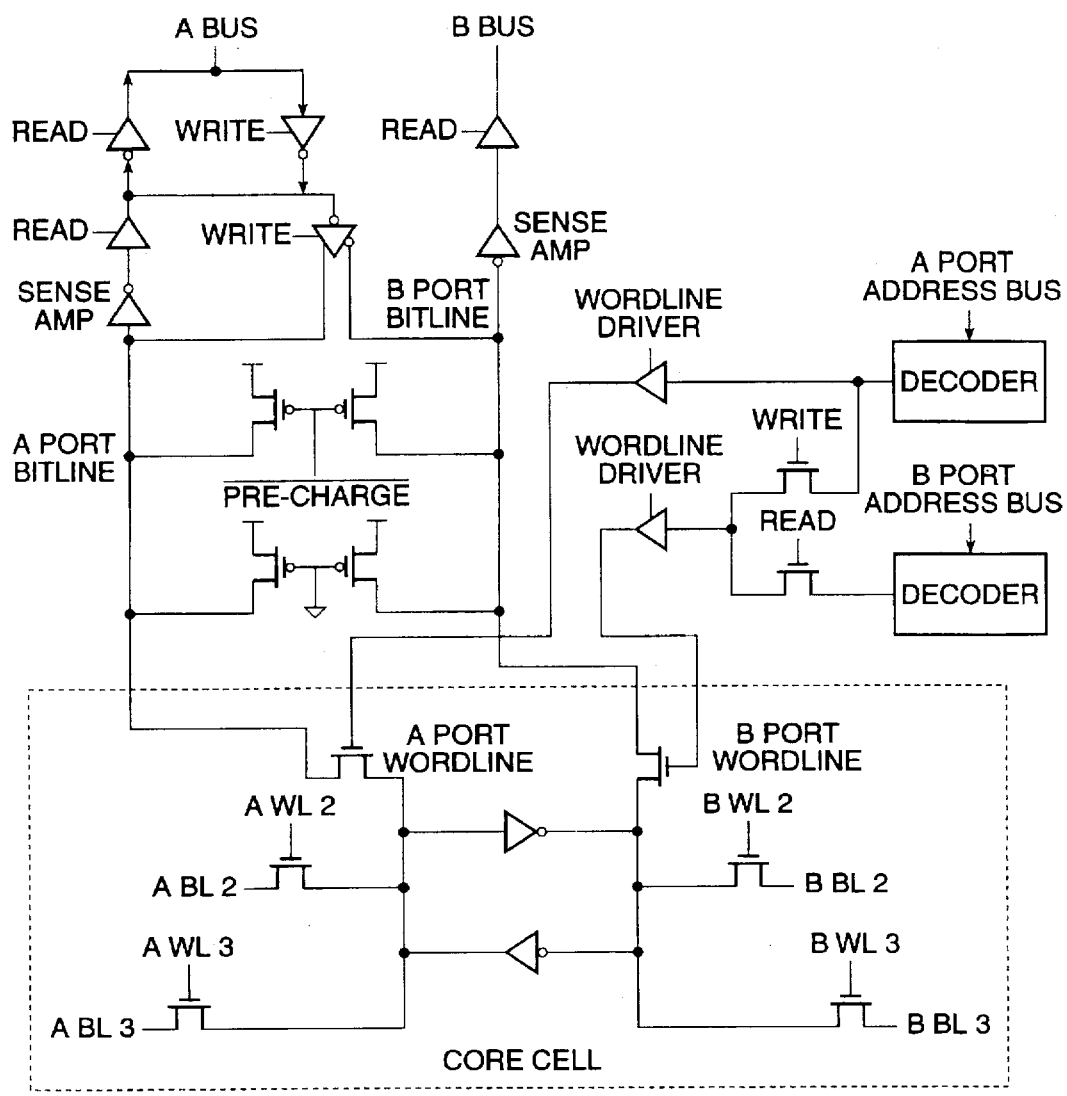
FIG. 1 is a schematic diagram of the prior art for a multiport register file memory.
Figure 4:
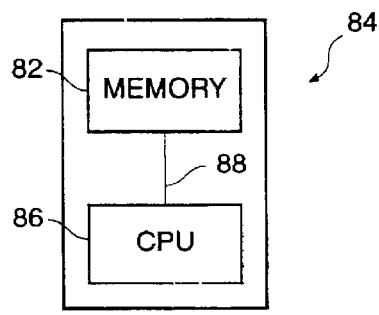
FIG. 4 is a schematic diagram of a multiport register file integrated with a computer system.

As seen in FIG. 4, the memory cell array discussed above is typically used as memory 82 for a computer system 84 having a processor such as a Central Processing Unit ("CPU") 86 and a bus 88 coupling the memory 88 to the CPU 86, as known in the art.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A multiport register file comprising:
   a storage element having first and second storage nodes, a positive voltage supply node, and a negative voltage supply node;
   a plurality of first switched bit lines coupled to said first storage node and a plurality of second switched bit lines coupled to said second storage node; and
   a first buffered switching circuit coupled to said negative voltage supply node of said storage element, said first buffered switching circuit for switching-on/off said storage element, wherein during a write operation said storage element is switched-off, and a small voltage swing of between about 0.2 and about 0.5 volts is placed on said first and second storage nodes from selected first and second switched bit lines, and, during a read operation said storage element amplifies said small voltage swing of between about 0.2 and about 0.5 volts to provide an amplified signal when said storage element is switched on.

2. A multiport register file according to claim 1 wherein:
a P-channel pass transistor providing for the switching function of each of said switched bit lines enabling access to said corresponding storage nodes.

3. A multiport register file according to claim 2 further comprising a second buffered switching circuit coupled to said positive voltage supply node of said storage element, said second buffered switching circuit for switching on/off said storage element.

4. A multiport register file according to claim 1 wherein:
a N-channel pass transistor providing for the switching function of each of said switched bit lines enabling access to said corresponding storage nodes.

5. A multiport register file according to claim 4 further comprising a second buffered switching circuit coupled to said positive voltage supply node of said storage element, said second buffered switching circuit for switching-on/off said storage element.

6. A multiport register file according to claim 1 further comprising a plurality of said storage elements defining a memory cell array, wherein said storage elements are connected to at least one buffered switching circuit for power-on/off control.

7. The multiport register file according to claim 1, further comprising:
a CPU; and
one or more data buses, wherein one of said data buses connects said CPU with the multiport register file.

8. A method for operating a multiport register file, comprising the steps of:
switching-off a storage element;
supplying a small voltage swing between about 0.2 and about 0.5 volts to a first and a second storage node of said storage element via selected switched bit lines; and
switching-on said storage element, said storage element amplifying said small voltage swing between about 0.2 and about 0.5 volts and holding a resulting amplified signal on said first and second storage nodes.

9. A method for providing a computer system, comprising the steps of:
providing a multiport register file, the provided multiport register file including:
switching-off a storage element;
supplying a small voltage swing between about 0.2 and about 0.5 volts to a first and a second storage node of said storage element via selected switched bit lines; and
switching-on said storage element, said storage element amplifying said small voltage swing between about 0.2 and about 0.5 volts and holding a resulting amplified signal on said first and second storage nodes.

10. A method for providing a computer system, according to claim 5, wherein said multiport register file further includes a plurality of said storage elements which define a memory cell array, wherein said storage elements are connected to at least one buffered switching circuit for power-on/off control.

11. A multiport register file comprising:
a controlled positive supply voltage rail;
a negative controlled supply voltage rail;
a storage element having cross-coupled first and second inverters,
said first inverter having a P-channel MOS transistor having a source connecting to said controlled positive supply voltage rail, a gate connecting to a gate of a N-channel MOS transistor and a second storage node of said second inverter, and a drain connecting to a drain of said N-channel MOS transistor forming a first storage node, said N-channel MOS transistor having a source connecting to said controlled negative supply voltage rail,
said second inverter having a P-channel MOS transistor having a source connecting to said controlled positive supply voltage rail, a gate connecting to a gate of a N-channel MOS transistor and to said first storage node of said first inverter, and a drain connecting to a drain of a N-channel MOS transistor forming said second storage node, said N-channel MOS transistor having a source connecting to said controlled negative supply voltage rail;
a plurality of first and second switched bit lines connecting to said first and second storage nodes;
a plurality of first and second write lines; and
a first buffered switching circuit coupled to said negative supply voltage rail, said first buffered switching circuit for providing a voltage potential to said negative supply voltage rail.

12. A multiport register file according to claim 11 wherein:
said first buffered switching circuit has an output providing a voltage potential to said controlled negative supply voltage rail in response to a first write enable signal placed on the input of said first buffered switching circuit; and
each of said first write lines connecting to the gate of a corresponding P-channel pass transistor having a source connecting to said first switched bit line and a drain connecting to said first storage node, wherein each of said second write lines connecting to the gate of a corresponding P-channel pass transistor having a source connecting to said second switched bit line and a drain connecting to said second storage node.

13. A multiport register file according to claim 11 further including:
a second buffered switching circuit having an output providing a voltage potential to said controlled positive supply voltage rail in response to a second write enable signal placed on the input of said first buffered switching circuit.

14. A multiport register file according to claim 11 wherein:
said first buffered switching circuit has an output providing a voltage potential to said controlled positive supply voltage rail in response to a first write enable signal placed on the input of said first buffered switching circuit; and
each of said first write lines connecting to the gate of a corresponding N-channel pass transistor having a source connecting to said first switched bit line and a drain connecting to said first storage node, wherein each of said second write lines connecting to the gate of a corresponding N-channel pass transistor having a source connecting to said second switched bit line and a drain connecting to said second storage node.

15. A multiport register file according to claim 11 further including:

a second buffered switching circuit having an output providing a voltage potential to said controlled negative supply voltage rail in response to a second write enable signal placed on the input of said second buffered switching circuit.

16. A multiport register file according to claim 11 further comprising a plurality of said storage elements defining a memory cell array, wherein said storage elements connecting to said first and controlled negative supply voltage rails, wherein at least one of said voltage nodes are connected to the output of a buffered switching circuit that has an input connecting to a corresponding supply control line.

* * * * *

UNITED STATES PATENT AND TRADEMARK OFFICE
CERTIFICATE OF CORRECTION

PATENT NO. : 5,724,299
DATED : March 3, 1998
INVENTOR(S) : Andrew V. Podlesny, Guntis V. Kristovsky, Yuri L. Pogrebnoy, Vladimir N. Kalmykov and Valeriy V. Lozovoy It is certified that error appears in the above-identified patent and that said Letters Patent is hereby corrected as shown below:

Column 1, line 17: replace "nine-ported" with --nine-port--.
Column 1, line 19: replace "nine-ported" with --nine-port--.
Column 1, line 37: replace "time the" with --time,--.
Column 1, line 40: replace "Third, the" with --Third,--.
Column 1, line 43: replace "Fourth, the" with --Fourth,--.
Column 1, line 46: replace: "the date" with --data--.
Column 1, line 51: replace "in" with --by the--.

Signed and Sealed this

Seventh Day of July, 1998

Attest:

BRUCE LEHMAN

*Attesting Officer*  *Commissioner of Patents and Trademarks*